United States Patent
Chiu

(10) Patent No.: US 7,932,591 B2
(45) Date of Patent: Apr. 26, 2011

(54) STACKED SEMICONDUCTOR PACKAGE HAVING FLEXIBLE CIRCUIT BOARD THEREIN

(75) Inventor: Chi-Tsung Chiu, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 31 days.

(21) Appl. No.: 11/744,196

(22) Filed: May 3, 2007

(65) Prior Publication Data

US 2007/0291458 A1 Dec. 20, 2007

(30) Foreign Application Priority Data

May 30, 2006 (TW) ................................ 95119250 A

(51) Int. Cl.
*H01L 23/02* (2006.01)
(52) U.S. Cl. ........ 257/686; 257/777; 257/691; 257/723; 257/E23.169; 257/E21.506; 408/109
(58) Field of Classification Search .................. 257/691, 257/723, 774, 775, 777, E21.506, E23.169; 438/109
See application file for complete search history.

(56) References Cited

U.S. PATENT DOCUMENTS

| 6,225,688 | B1* | 5/2001 | Kim et al. ..................... | 257/686 |
| 6,803,649 | B1 | 10/2004 | He | |
| 2005/0233496 | A1* | 10/2005 | Haba et al. .................... | 438/109 |
| 2006/0252181 | A1* | 11/2006 | King et al. .................... | 438/107 |
| 2009/0108432 | A1* | 4/2009 | Lee .............................. | 257/686 |

* cited by examiner

*Primary Examiner* — Cuong Q Nguyen
*Assistant Examiner* — Cathy N Lam
(74) *Attorney, Agent, or Firm* — Winston Hsu; Scott Margo

(57) ABSTRACT

The present invention relates to a stacked semiconductor package having flexible circuit board therein. The semiconductor package comprises a substrate and a chip assembly. The chip assembly comprises at least a first chip, a second chip and a flexible circuit board. The second chip is disposed above the first chip, and is electrically connected to the first chip by the flexible circuit board. The chip assembly is electrically connected to the substrate. As a result, the interposer of prior art is omitted, the overall thickness of the stacked semiconductor package of the present invention is reduced, and the manufacturing procedure is simplified.

8 Claims, 7 Drawing Sheets

STACKED SEMICONDUCTOR PACKAGE HAVING FLEXIBLE CIRCUIT BOARD THEREIN

BACKGROUND OF THE INVENTION

1. Field of the Invention

The present invention relates to a stacked semiconductor package. In particular, the present invention relates to a stacked semiconductor package having a flexible circuit board therein.

2. Description of the Prior Art

Please refer to FIG. 1, illustrating a cross-sectional view of a conventional stacked semiconductor package. The conventional stacked semiconductor package includes a substrate 1, a first chip 12, a spacer 13, a second chip 14, a plurality of first wires 15, a plurality of second wires 16 and a molding material 17.

The substrate 11 has an upper surface 111 and a lower surface 112. The first chip 12 has an upper surface 121 and a lower surface 122. The lower surface 122 of the first chip 12 is attached to the upper surface 111 of the substrate 11 by a first adhesive 181. The spacer 13 is attached to the upper surface 121 of the first chip 12 by a second adhesive 182. The second chip 14 has an upper surface 141 and a lower surface 142. The lower surface 142 of the second chip 14 is attached to the spacer 13 by a third adhesive 183. The first wires 15 are electrically connected to the upper surface 121 of the first chip 12 and the upper surface 111 of the substrate 11. The second wires 16 are electrically connected to the upper surface 141 of the second chip 14 and the upper surface 111 of the substrate 11. The molding material 17 is used to cover the upper surface 111 of the substrate 11, the first chip 12, the spacer 13, the second chip 14, the first wires 15 and the second wires 16.

In the conventional stacked semiconductor package 1, in order to avoid the second chip 14 damaging the first wires 15 due to its weight, a thicker spacer 13 is set up to support the second chip 14 to increase the distance between the first chip 12 and the second chip 14. However, it not only increases the total height of the semiconductor package 1, but also the alignment of the spacer 13 is difficult during the process and therefore the misalignment easily damages the first wires 15.

Therefore, a novel and inventive stacked semiconductor package must be provided to solve the problem.

SUMMARY OF THE INVENTION

The main purpose of the present invention provides a stacked semiconductor package having a flexible circuit board therein. The stacked semiconductor package includes a substrate and a chip assembly. The chip assembly includes at least a first chip, a second chip and a flexible circuit board. The second chip is disposed above the first chip and is connected to the first chip through the flexible circuit board and the chip assembly is electrically connected to the substrate. By doing so, the conventional spacer may be omitted, so that the total height of the semiconductor package can be effectively reduced and the process can be simplified to reduce the cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
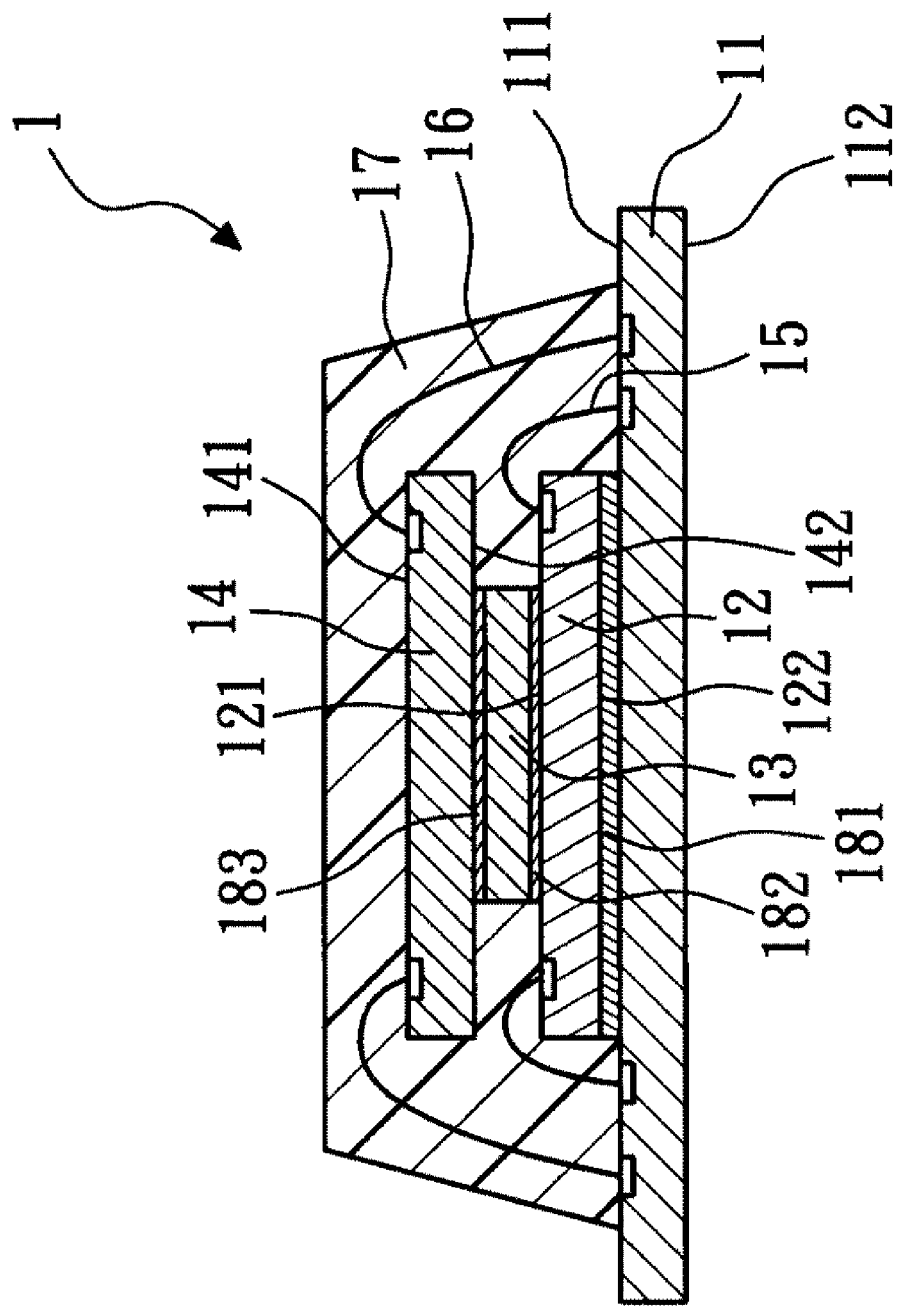
FIG. 1 illustrates a cross-sectional view of a conventional stacked semiconductor package.
Figure 2:
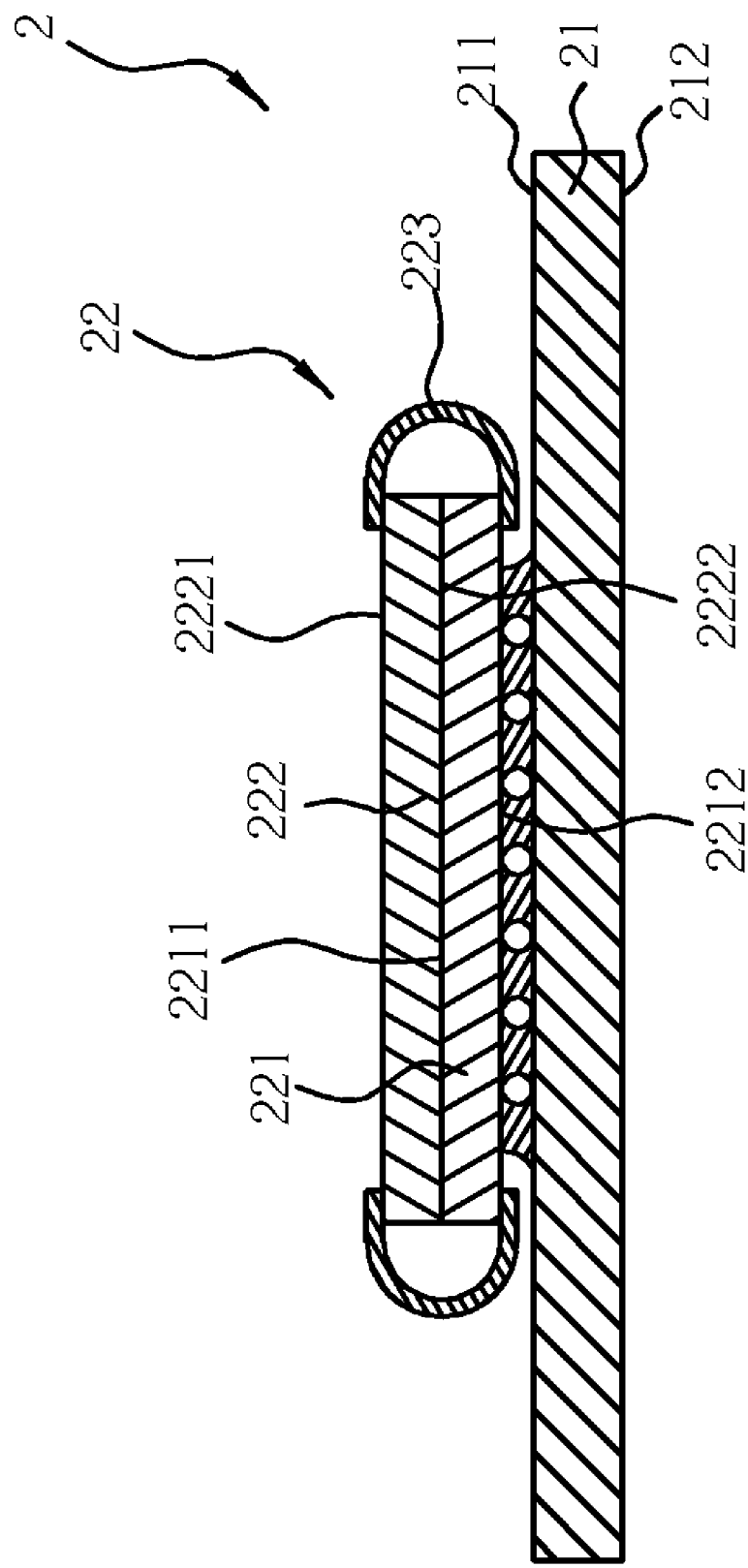
FIG. 2 illustrates a cross-sectional view of a first embodiment of the stacked semiconductor package having flexible circuit board therein of the present invention.

Please refer to FIG. 2, illustrating a cross-sectional view of a first embodiment of the stacked semiconductor package having flexible circuit board therein of the present invention. The stacked semiconductor package 2 of the embodiment includes a substrate 21 and a chip assembly 22. The substrate 21 has an upper surface 211 and a lower surface 212. The chip assembly 22 includes a first chip 221, a second chip 222 and a flexible circuit board 223. The first chip 221 has an upper surface 2211 and a lower surface 2212. The second chip 222 has an upper surface 2221 and a lower surface 2222. The second chip 222 is disposed above the first chip 221 and is electrically connected to the first chip 221 through the flexible circuit board 223. The flexible circuit board 223 has a plurality of parallel wires, whose ends may be connected to the corresponding solder pads on the chips.

In this embodiment, the flexible circuit board 223 connects the upper surface 2221 of the second chip 222 and the lower surface 2212 of the first chip 221, and the lower surface 2212 of the first chip 221 is attached to the upper surface 211 of the substrate 21 by way of flip-chip, so that the chip assembly 22 may be electrically connected to the substrate 21. In addition, if necessary, a molding material (not shown) may be added to cover the chip assembly 22 and the upper surface 211 of the substrate 21.

In this embodiment, the conventional spacer may be omitted so that the total height of the semiconductor package can be effectively reduced and the process can be simplified to reduce the cost.

Figure 3:
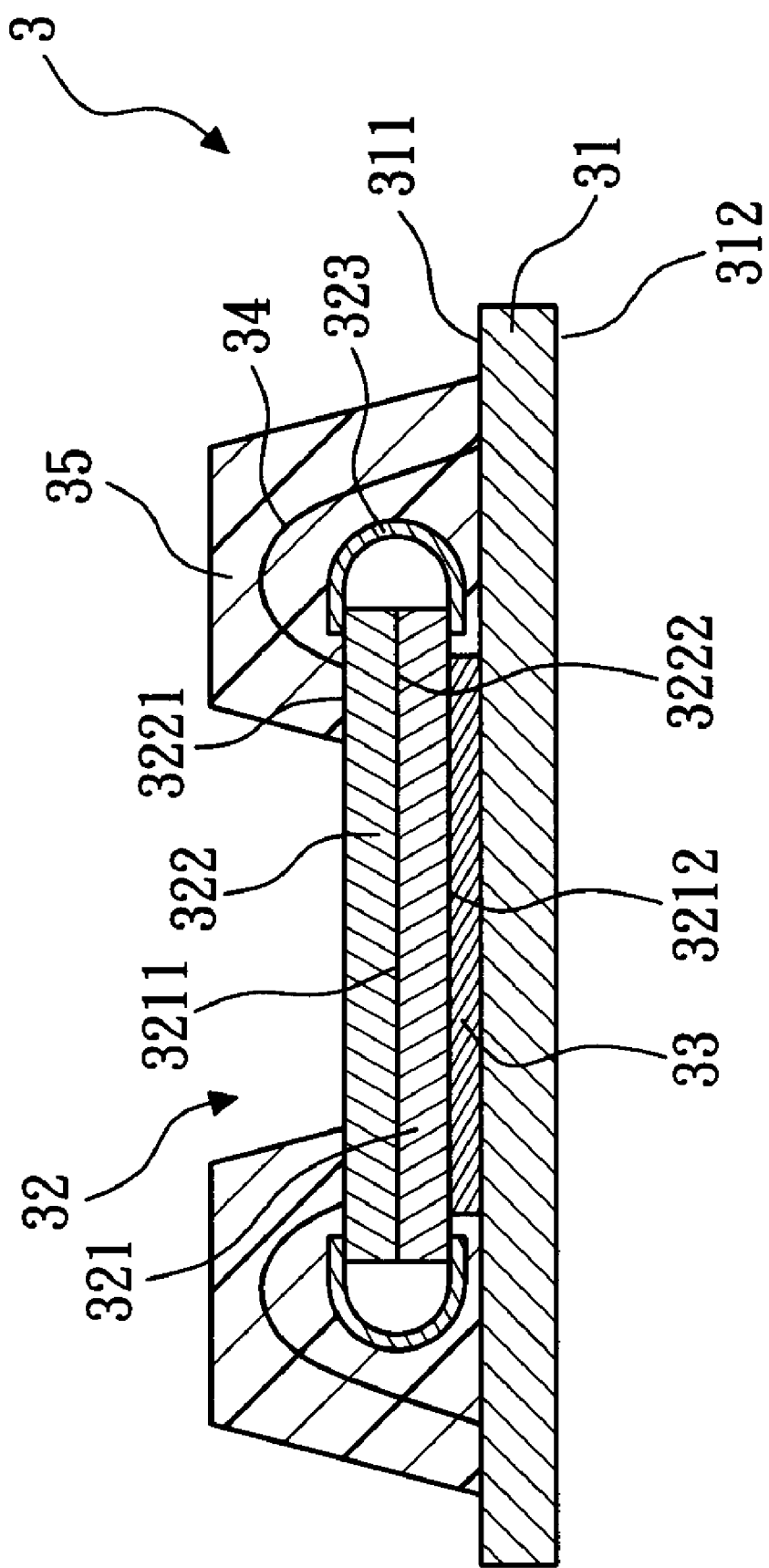
FIG. 3 illustrates a cross-sectional view of a second embodiment of the stacked semiconductor package having flexible circuit board therein of the present invention.

Please refer to FIG. 3, illustrating a cross-sectional view of a second embodiment of the stacked semiconductor package having flexible circuit board therein of the present invention. The stacked semiconductor package 3 of the embodiment includes a substrate 31 and a chip assembly 32. The substrate 31 has an upper surface 311 and a lower surface 312. The chip assembly 32 includes a first chip 321, a second chip 322 and a flexible circuit board 323. The first chip 321 has an upper surface 3211 and a lower surface 3212. The second chip 322 has an upper surface 3221 and a lower surface 3222. The second chip 322 is disposed above the first chip 321 and is electrically connected to the first chip 321 through the flexible circuit board 323. The flexible circuit board 323 has a plurality of parallel wires, whose ends may be connected to the corresponding solder pads on the chips.

In this embodiment, the flexible circuit board 323 connects the upper surface 3221 of the second chip 322 and the lower surface 3212 of the first chip 321, and the stacked semiconductor package 3 further includes a spacer 33, a plurality of wires 34 and a molding material 35. The spacer 33 is disposed between the lower surface 3212 of the first chip 321 and the upper surface 311 of the substrate 311. The wires 34 electrically connect the upper surface 3221 of the second chip 322 and the upper surface 311 of the substrate 31, so that the chip assembly 32 may be electrically connected to the substrate 31. The molding material 35 covers the chip assembly 32, the spacer 33, the wires 34 and the upper surface 311 of the substrate 31. To facilitate the flow of the molding material 35, the flexible circuit board 323 has a plurality of holes (not shown). It is understandable that these holes are parallel with the wires on the flexible circuit board 323.

In this embodiment, the thickness of the spacer 33 may be thinner than the conventional spacer so that the total height of the semiconductor package 3 can be effectively reduced.

Figure 4:
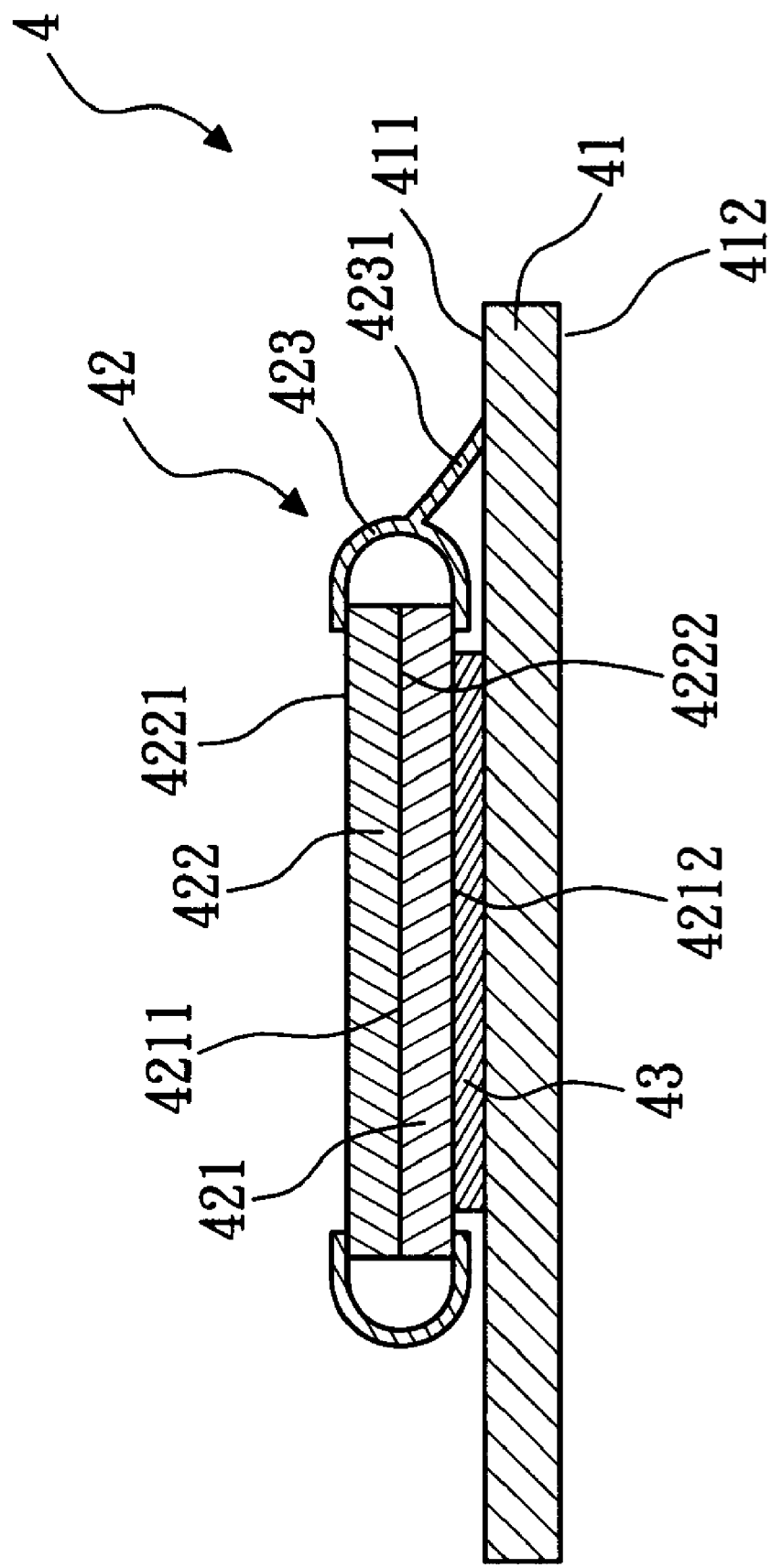
FIG. 4 illustrates a cross-sectional view of a third embodiment of the stacked semiconductor package having flexible circuit board therein of the present invention.

Please refer to FIG. 4, illustrating a cross-sectional view of a third embodiment of the stacked semiconductor package having flexible circuit board therein of the present invention. The stacked semiconductor package 4 of the embodiment includes a substrate 41 and a chip assembly 42. The substrate 41 has an upper surface 411 and a lower surface 412. The chip assembly 42 includes a first chip 421, a second chip 422 and a flexible circuit board 423. The first chip 421 has an upper surface 4211 and a lower surface 4212. The second chip 422 has an upper surface 4221 and a lower surface 4222. The second chip 422 is disposed above the first chip 421 and is electrically connected to the first chip 421 through the flexible circuit board 423. The flexible circuit board 423 has a plurality of parallel wires, whose ends may be connected to the corresponding solder pads on the chips.

In this embodiment, the flexible circuit board 423 connects the upper surface 4221 of the second chip 422 and the lower surface 4212 of the first chip 421, and the flexible circuit board 423 further includes a branch circuit board 4231 for connecting to the upper surface 411 of the substrate 41 so that the chip assembly 42 is electrically connected to the substrate 41. The stacked semiconductor package 4 further includes a spacer 43, which is disposed between the lower surface 4212 of the first chip 421 and the upper surface 411 of the substrate 41.

Figure 5:
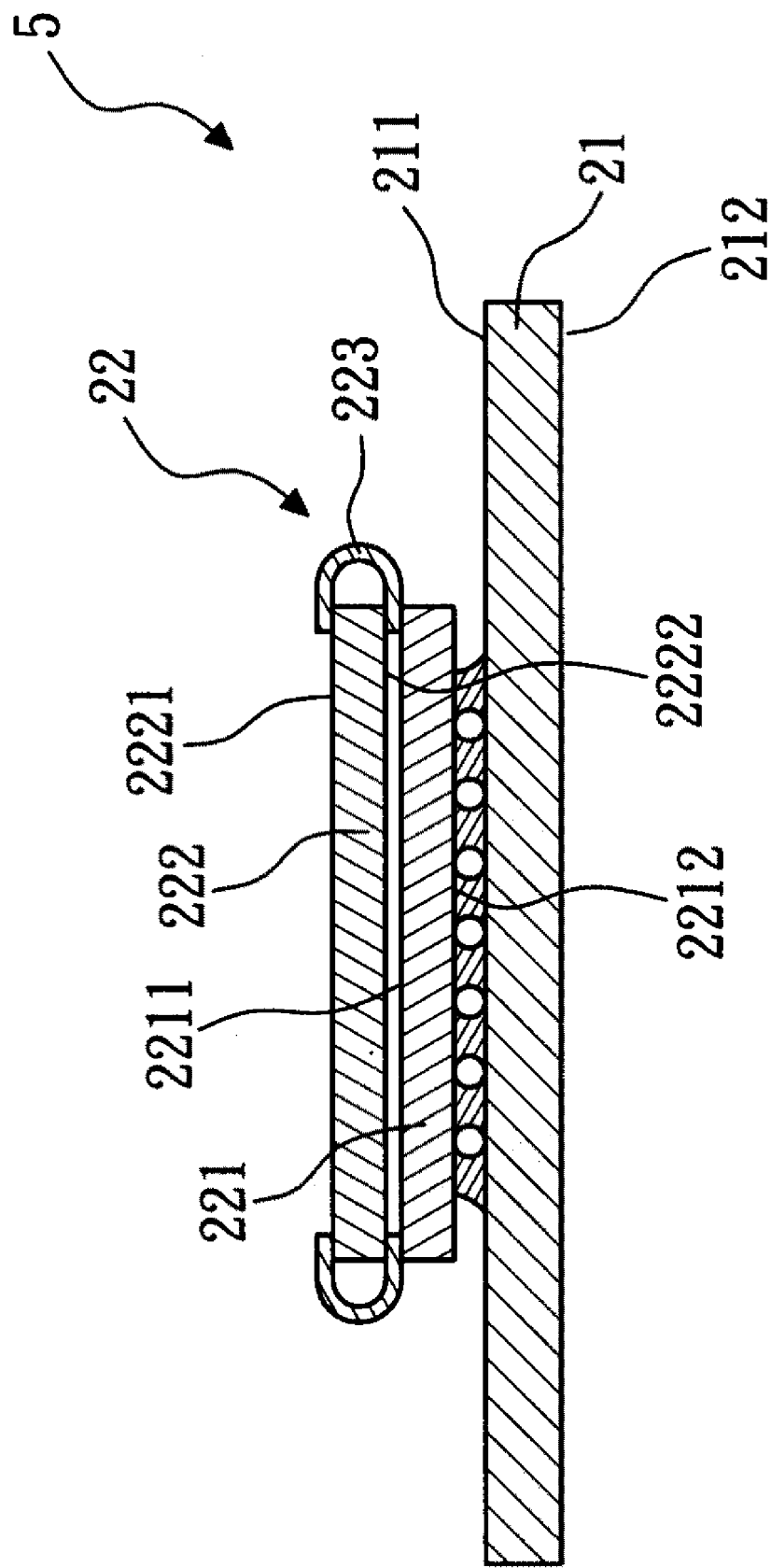
FIG. 5 illustrates a cross-sectional view of a fourth embodiment of the stacked semiconductor package having flexible circuit board therein of the present invention.

Please refer to FIG. 5, illustrating a cross-sectional view of a fourth embodiment of the stacked semiconductor package having flexible circuit board therein of the present invention. The stacked semiconductor package 5 of the present invention resembles the stacked semiconductor package 2 (FIG. 2) of the first embodiment and similar parts share similar numbers. The difference between the stacked semiconductor package 5 and the stacked semiconductor package 2 resides in the connection of the flexible circuit board 223. In the stacked semiconductor package 5 of the embodiment, the flexible circuit board 223 connects the upper surface 2221 of the second chip 222 and the upper surface 2211 of the first chip 221.

Figure 6:
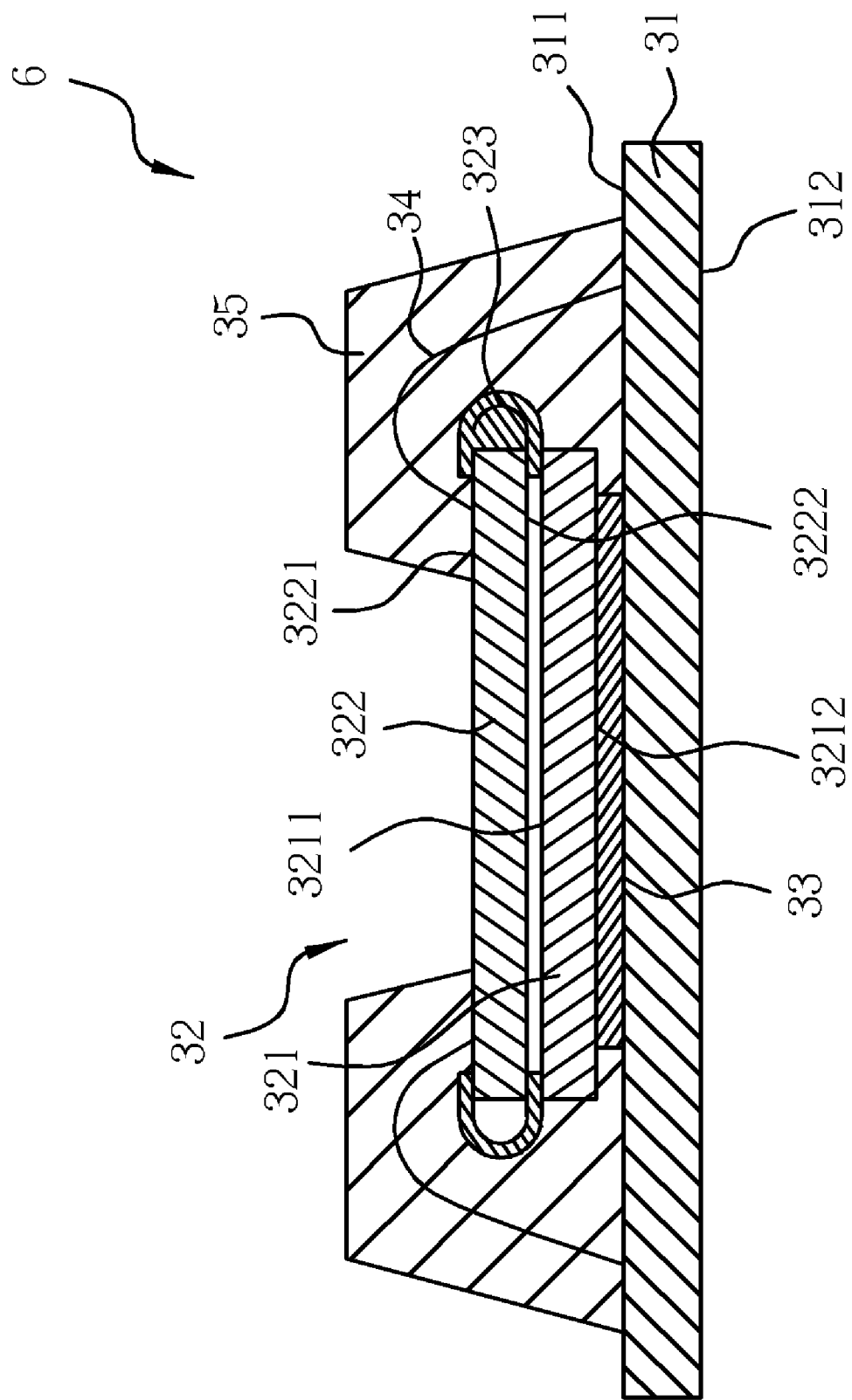
FIG. 6 illustrates a cross-sectional view of a fifth embodiment of the stacked semiconductor package having flexible circuit board therein of the present invention.

Please refer to FIG. 6, illustrating a cross-sectional view of a fifth embodiment of the stacked semiconductor package structure having flexible circuit board therein of the present invention. The stacked semiconductor package 6 of the present invention resembles the stacked semiconductor package 3 (FIG. 3) of the second embodiment and similar parts share similar numbers. The difference between the stacked semiconductor package 6 and the stacked semiconductor package 3 of the second embodiment resides in the connection of the flexible circuit board 323. In the stacked semiconductor package 6 of the embodiment, the flexible circuit board 323 connects the upper surface 3221 of the second chip 322 and the upper surface 3211 of the first chip 321.

Figure 7:
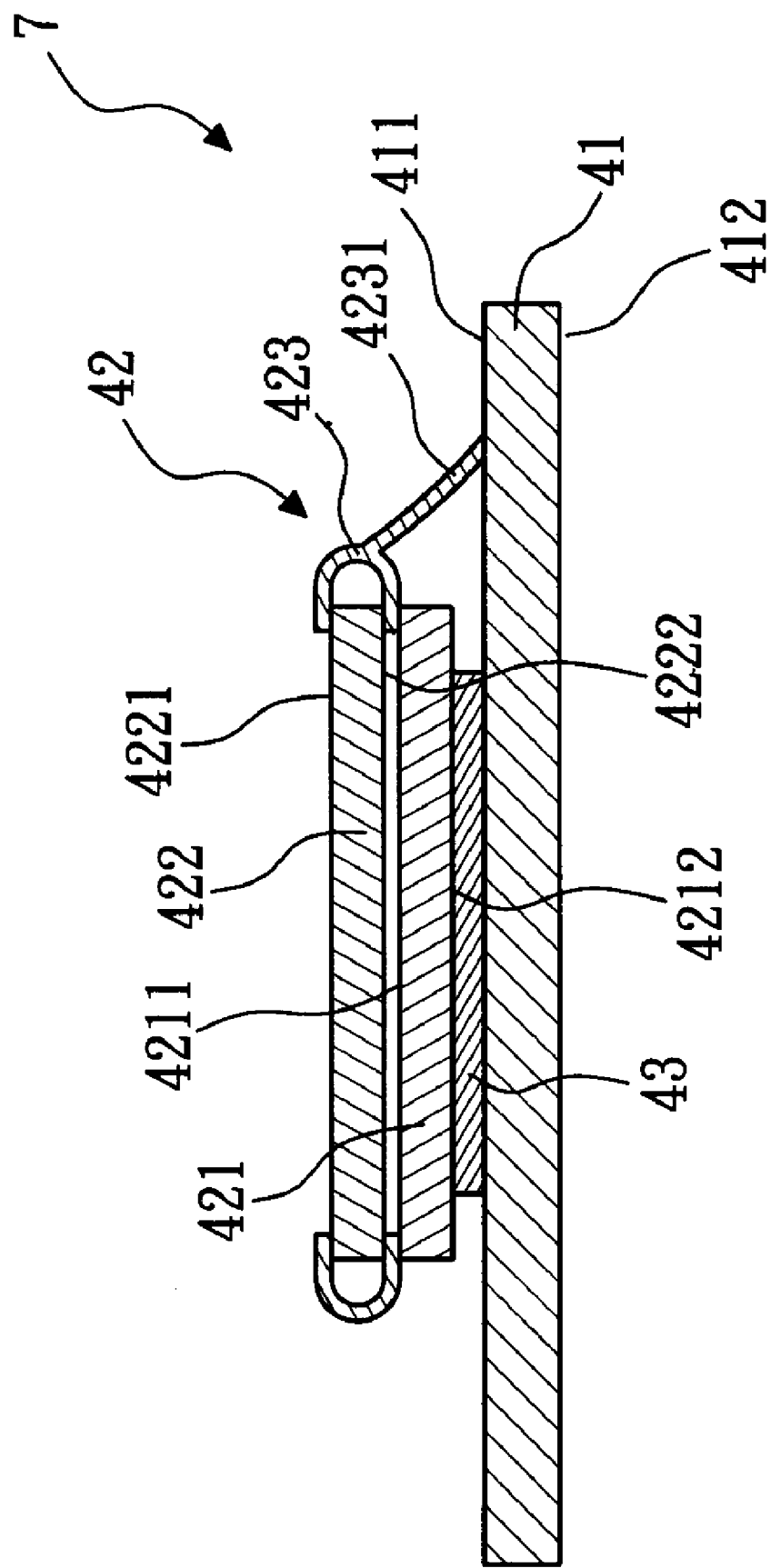
FIG. 7 illustrates a cross-sectional view of a sixth embodiment of the stacked semiconductor package having flexible circuit board therein of the present invention.

Please refer to FIG. 7, illustrating a cross-sectional view of a sixth embodiment of the stacked semiconductor package structure having flexible circuit board therein of the present invention. The stacked semiconductor package 7 of the present invention resembles the stacked semiconductor package 4 (FIG. 4) of the third embodiment and similar parts share similar numbers. The difference between the stacked semiconductor package 7 and the stacked semiconductor package 4 of the third embodiment resides in the connection of the flexible circuit board 423. In the stacked semiconductor package 7 of the embodiment, the flexible circuit board 423 connects the upper surface 4221 of the second chip 422 and the upper surface 4211 of the first chip 421.

Those skilled in the art will readily observe that numerous modifications and alterations of the device and method may be made while retaining the teachings of the invention.

What is claimed is:

1. A stacked semiconductor package having a flexible circuit board therein, comprising:
   a substrate; and
   a chip assembly comprising at least a first chip which is directly electrically connected to the substrate without being through said flexible circuit board, a second chip and said flexible circuit board, wherein said second chip directly contacts said first chip and is disposed above said first chip and is electrically connected to the first chip through said flexible circuit board and said chip assembly is electrically connected to said substrate, wherein said flexible circuit board is solely disposed at an edge side of said second chip and of said first chip without passing through an upper surface and a lower surface of said second chip and of said first chip.

2. The stacked semiconductor package of claim 1, further comprising a molding material for covering a surface of said substrate and said chip assembly.

3. The stacked semiconductor package of claim 1, wherein said substrate has an upper surface and said first chip is attached to said upper surface of said substrate.

4. The stacked semiconductor package of claim 3, wherein said first chip is attached to said upper surface of said substrate by way of flip-chip.

5. The stacked semiconductor package of claim 3, further comprising a spacer disposed between said first chip and said upper surface of said substrate.

6. The stacked semiconductor package of claim 1, further comprising a plurality of wires for connecting said second chip and said substrate.

7. The stacked semiconductor package of claim 1, wherein said flexible circuit board further comprises a plurality of holes.

8. The stacked semiconductor package of claim 1, wherein said flexible circuit board connects said upper surface of said second chip and said lower surface of said first chip.

* * * * *